(12) United States Patent
Levy

(10) Patent No.: US 11,757,060 B2
(45) Date of Patent: Sep. 12, 2023

(54) SHORT-WAVE INFRARED FOCAL PLANE ARRAYS, AND METHODS FOR UTILIZATION AND MANUFACTURING THEREOF

(71) Applicant: TriEye Ltd., Tel Aviv (IL)

(72) Inventor: Uriel Levy, Tel Aviv (IL)

(73) Assignee: TriEye Ltd., Tel Aviv (IL)

( * ) Notice: Subject to any disclaimer, the term of this patent is extended or adjusted under 35 U.S.C. 154(b) by 0 days.

(21) Appl. No.: 18/011,882

(22) PCT Filed: Aug. 16, 2021

(86) PCT No.: PCT/IB2021/057514
§ 371 (c)(1),
(2) Date: Dec. 21, 2022

(87) PCT Pub. No.: WO2022/043820
PCT Pub. Date: Mar. 3, 2022

(65) Prior Publication Data
US 2023/0187570 A1 Jun. 15, 2023

Related U.S. Application Data

(60) Provisional application No. 63/072,249, filed on Aug. 31, 2020.

(51) Int. Cl.
*H01L 31/14* (2006.01)
*H01L 31/18* (2006.01)
(Continued)

(52) U.S. Cl.
CPC ........ *H01L 31/14* (2013.01); *H01L 21/02271* (2013.01); *H01L 21/707* (2013.01); *H01L 31/1804* (2013.01); *H01L 31/186* (2013.01)

(58) Field of Classification Search
CPC . H01L 31/14; H01L 21/02271; H01L 21/707; H01L 31/1804; H01L 31/186;
(Continued)

(56) References Cited

U.S. PATENT DOCUMENTS 9,437,759 B2 * 9/2016 Baehr-Jones ..... H01L 27/14649
9,812,598 B2 * 11/2017 Baehr-Jones ......... H01L 31/107
(Continued)

FOREIGN PATENT DOCUMENTS

WO 2019138301 A1 7/2019
WO 2019155435 A1 8/2019

OTHER PUBLICATIONS

International Search Report and Written Opinion in related PCT application PCT/IB2021/057514, dated Nov. 22, 2021.
(Continued)

*Primary Examiner* — Earl N Taylor
(74) *Attorney, Agent, or Firm* — Nathan & Associates; Menachem Nathan

(57) ABSTRACT

Short-wave infrared (SWIR) focal plane arrays (FPAs) comprising a Si layer through which light detectable by the FPA reaches photodiodes of the FPA, at least one germanium (Ge) layer including a plurality of distinct photosensitive areas including at least one photosensitive area in each of a plurality of photosensitive photosites, each of the distinct photosensitive areas comprising a plurality of proximate steep structures of Ge having height of at least 0.5 µm and a height-to-width ratio of at least 2, and methods for forming same.

20 Claims, 7 Drawing Sheets

(51) Int. Cl.
*H01L 21/02* (2006.01)
*H01L 21/70* (2006.01)

(58) Field of Classification Search
CPC ......... H01L 27/14669; H01L 27/14649; H01L 27/1465
See application file for complete search history.

(56) References Cited

U.S. PATENT DOCUMENTS

| | | | |
|---|---|---|---|
| 11,063,079 B2* | 7/2021 | Bakal | H01L 27/14643 |
| 2010/0006961 A1* | 1/2010 | Yasaitis | H01L 31/18 257/431 |
| 2019/0214428 A1* | 7/2019 | Nagaraja | H01L 27/1462 |
| 2020/0058697 A1* | 2/2020 | Meylan | H01L 27/1465 |
| 2020/0273893 A1* | 8/2020 | Burkhart | H01L 27/1469 |
| 2020/0365630 A1* | 11/2020 | Levy | H01L 27/1465 |

OTHER PUBLICATIONS

Office Action in related TW patent application 110130963, dated Nov. 11, 2022.

* cited by examiner

200

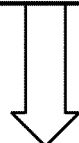

202 — Etching a germanium layer implemented on a silicon wafer so as to remove different amount of germanium from different locations of the germanium layer, so as to yield for each out of a plurality of pixels of the IR focal plane array at least one distinct photosensitive area of germanium which comprises a plurality of proximate structures of germanium having height of at least 0.5μm and which have a height to width ratio of at least 2

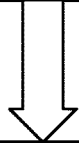

204 — Depositing filler material on the etched germanium, to fill the gaps between the proximate structures of germanium up to at least a mean height of the proximate structures of germanium

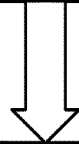

206 — Polishing a top surface of the silicon wafer [the top surface including the filler material and possibly also germanium] for preparing the silicon wafer for bonding with another wafer of the photosensitive detection array 208 — Depositing a metal layer for creating a plurality of electric contacts for each out of the plurality of pixels for reading out detection information detected by the respective pixel

FIG. 2

SHORT-WAVE INFRARED FOCAL PLANE ARRAYS, AND METHODS FOR UTILIZATION AND MANUFACTURING THEREOF

CROSS REFERENCE TO RELATED APPLICATIONS

This is a 371 application from international patent application PCT/IB2021/057514 filed Aug. 16, 2021, which claims priority from U.S. provisional patent application No. 63/072,249 filed Aug. 31, 2020, and which is incorporated herein by reference in its entirety.

FIELD

This disclosure is related to short wave infrared (SWIR) focal plane arrays (FPAs), to methods for utilization and manufacturing thereof, and especially to SWIR FPAs which include a Germanium (Ge) component as part of their photosensitive pixels.

BACKGROUND

Reflectance, transmittance and absorbance of deeply etched Ge is studied by Steglich, Martin, et at., and is discussed in their article "Black Ge Fabricated by Reactive Ion Etching" published in Appl. Phys. A (2016) 122:836, DOI 10.1007/s00339-016-0318-y. There is a need in the industry for techniques for manufacturing and utilization of economical yet efficient focal plane array (FPA) sensors that comprise Germanium (Ge) photosensitive components on a silicon (Si) substrate.

Further limitations and disadvantages of conventional, traditional, and proposed approaches will become apparent to one of skill in the art, through comparison of such approaches with the subject matter of the present application as set forth in the remainder of the present application with reference to the drawings.

SUMMARY

In various embodiments, there is provided a method for manufacturing a SWIR FPA, comprising: etching a Ge layer implemented on a Si wafer to remove different amounts of Ge from different locations of the Ge layer, so as to yield for each of a plurality of photosites of the SWIR focal plane array at least one distinct photosensitive area of Ge that comprises a plurality of proximate structures of Ge having a height of at least 0.3 µm and a height-to-width ratio of at least 2; depositing filler material on the etched Ge layer to fill gaps between the proximate structures of Ge up to at least a mean height of the proximate structures of Ge; polishing a top surface of the Si wafer to prepare the Si wafer for bonding with another wafer of a photosensitive detection array; and depositing a metal layer for creating a plurality of electric contacts for each out of the plurality of photosites for reading out detection information detected by the respective photosite.

In some embodiments, the etching of the Ge layer comprises protecting for each photosite of the focal plane array a flat portion of Ge, and wherein the depositing of the metal layer comprises creating a metal electric contact connected to the respective distinct photosensitive Ge area at the flat portion, for reading out electric data from the respective distinct photosensitive Ge area.

In some embodiments, the etching comprises etching the Ge layer at a side of the Ge layer through which light escapes the Ge after entering the Ge layer from the Si layer.

In some embodiments, a method further comprises polishing a Si substrate of the Si wafer to a thickness of less than 20 µm. In some embodiments, the polishing of the Si substrate is followed by bonding at least one dielectric layer to the polished side of the Si substrate for the purpose of manipulating at least one light property of light passing through, the at least one property selected from a group consisting of: the amplitude, phase, polarization and/or spectral properties of light.

In some embodiments, a method further comprises bonding the Si wafer on which the Ge layer was etched to a Readout Integrated Circuit (ROIC) wafer, such that electrodes of the Si wafer touch electrodes of the ROIC wafer, thereby enabling processing by the ROIC wafer of electric signals corresponding to a number of photons captured by the Ge based photosites of the Si wafer.

In some embodiments, a thickness of the Ge layer is less than 10 µm.

In some embodiments, the etching of the Ge layer is preceded by growing the Ge layer on the Si wafer; wherein the growing is preceded by processing a Si layer on which the Ge is deposited, the processing comprising at least one process selected from a group of wafer processing stages consisting of: doping, welling, passivation, and electrical contacts depositing.

In some embodiments, the Ge layer comprises of unconnected areas of Ge, each deposited onto a Si layer within a depression created within a previously deposited layer deposited on the Si layer on which the Ge is grown.

In some embodiments, the mean height of the proximate structures of Ge is larger than 1 µm and wherein a mean height-to-width ratio of the proximate structures of Ge is at least 5.

In some embodiments, the depositing comprising at least one depositing process selected from the group of processes consisting of chemical vapor deposition of the filler and sputtering of the filler.

In some embodiments, a method further comprises doping the Ge such as to make a photodiode which includes the Ge, and which can detect SWIR light.

In some embodiments, a method further comprises doping the Si such as to make a diode in the Si for the purpose of photodetection of SWIR light that will be absorbed in the Ge and will generate carriers that will be transported to the Si layer.

In various embodiments, there is provided a SWIR FPA with a plurality of photosensitive photosites, comprising: a Si layer through which light detectable by the FPA reaches photodiodes of the FPA; at least one Ge layer including a plurality of distinct photosensitive areas including at least one photosensitive area in each of the plurality of photosensitive photosites, each of the distinct photosensitive areas comprising a plurality of proximate structures of Ge having height of at least 0.5 µm and a height-to-width ratio of at least 2; a passivation layer covering the plurality of distinct photosensitive areas, wherein the passivation layer fills gaps between the proximate structures of Ge up to at least a mean height of the proximate structures of Ge; a polished top surface to which another wafer of a photosensitive detection array may be bonded; and a plurality of metal electrodes for transmitting electric signals indicative of number of photons absorbed by the different distinct photosensitive areas of Ge to the other wafer.

In some embodiments, each photosite of the FPA comprises a flat portion of Ge coupled to the plurality of proximate structures of the respective photosite, and at least one metal electrode coupled to the flat portion.

In some embodiments, a thickness of the Si layer is less than 20 µm.

In some embodiments, a SWIR FPA further comprises at least one photo effective layer bonded to the polished side of the Si layer.

In some embodiments, a thickness of the Ge layer is below 5 µm.

In some embodiments, the mean height of the proximate structures of Ge is larger than 1 µm and wherein a mean height-to-width ratio of the proximate structures of Ge is at least 5.

In some embodiments, a SWIR FPA further comprises a second plurality of second photosites which includes substantially flat patches of Ge, wherein each of the second photosites comprises at least one electrode connectable to the other wafer.

In various embodiments, there is provided an electro-optical (EO) detection system, comprising a SWIR FPA as above or below and in addition: at least one optical interface for directing light from a field of view of the EO detection system onto the SWIR FPA; a ROIC wafer bonded to the Si wafer of the FPA, wherein metal electrodes of the Si wafer touch metal electrodes of the ROIC wafer, thereby enabling processing by the ROIC wafer of electric signals corresponding to a number of photons captured by the Ge based photosites of the Si wafer, wherein the ROIC wafer comprises at least one output interface for providing detection data indicative of the number of photons detected by different photosites to an external system; and a processor, operable to process the detection data provided by the ROIC wafer in order to provide an IR image of the field of view.

BRIEF DESCRIPTION OF THE DRAWINGS

Non-limiting examples of embodiments disclosed herein are described below with reference to figures attached hereto that are listed following this paragraph. Identical structures, elements or parts that appear in more than one figure may be labeled with a same numeral in all the figures in which they appear. The drawings and descriptions are meant to illuminate and clarify embodiments disclosed herein, and should not be considered limiting in any way. All the drawings show devices or flow charts in accordance with examples of the presently disclosed subject matter. In the drawings:

FIG. 2 illustrates an embodiment of a method for manufacturing a FPA, in accordance with examples of the presently disclosed subject matter;

DETAILED DESCRIPTION

Figure 1A:
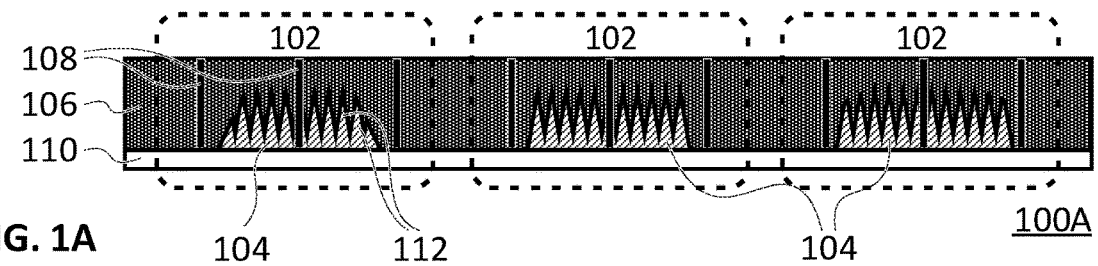
FIGS. 1A through 1J are schematic functional cross section illustrations illustrating examples of short-wave infrared focal plane array (FPA) sensors, in accordance with the examples of the presently disclosed subject matter.

In the following detailed description, numerous specific details are set forth in order to provide a thorough understanding of the disclosure. However, it will be understood by those skilled in the art that the present disclosure may be practiced without these specific details. In other instances, well-known methods, procedures, and components have not been described in detail so as not to obscure the present disclosure.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "processing", "calculating", "computing", "determining", "generating", "setting", "configuring", "selecting", "defining", or the like, include action and/or processes of a computer that manipulate and/or transform data into other data, said data represented as physical quantities, e.g., such as electronic quantities, and/or said data representing the physical objects.

The terms "computer", "processor", and "controller" should be expansively construed to cover any kind of electronic device with data processing capabilities, including, by way of non-limiting example, a personal computer, a server, a computing system, a communication device, a processor (e.g. digital signal processor (DSP), a microcontroller, a field programmable gate array (FPGA), an application specific integrated circuit (ASIC), etc.), any other electronic computing device, and or any combination thereof.

The operations in accordance with the teachings herein may be performed by a computer specially constructed for the desired purposes or by a general-purpose computer specially configured for the desired purpose by a computer program stored in a computer readable storage medium.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus, the appearance of the phrase "one case", "some cases", "other cases" or variants thereof does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable subcombination.

In embodiments of the presently disclosed subject matter one or more stages illustrated in the figures may be executed in a different order and/or one or more groups of stages may be executed simultaneously and vice versa. The figures illustrate a general schematic of the system architecture in accordance with an embodiment of the presently disclosed subject matter. Each module in the figures can be made up of any combination of software, hardware and/or firmware that performs the functions as defined and explained herein. The modules in the figures may be centralized in one location or dispersed over more than one location.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

FIGS. 1A through 1E are schematic functional cross section illustrations illustrating examples of short-wave infrared focal plane array (FPA) sensors 100 (also referred to as FPA 100), in accordance with the examples of the presently disclosed subject matter. In each of these illustrations, three photosites (PSs) 102 (also referred to as "pixels") of FPA 100 are shown, for simplicity, even though a significantly larger number of PSs can be implemented in the actual FPA 100, e.g., arranged as a 1-dimensional (1D) or as a 2-dimensional (2D) array. While the different PSs may be separated from one another in any suitable way (e.g., trenches), such separations are not illustrated in FIGS. 1A through 1E, for the sake of simplicity. In different illustrations, the reference numbers used for FPA 100 includes an identifying letter (e.g., 100A, 100B . . . 100E).

Each PS 102 of FPA 100 includes at least one Ge patch 104, which may optionally serve as an anode or a cathode for a semiconductor photodiode which also includes Si as the corresponding cathode or anode. The at least one Ge patch 104 contacts a layer 106 of Si oxide ($SiO_2$) or another material, e.g., Si nitride ($Si_3N_4$) which can be implemented as a passivation layer and/or also as a layer having another functionality, such as a planarization layer. Different shapes of Ge patches 104 are illustrated in the different PSs 102, but it is noted that, while not necessarily so, a single FPA 100 may include Ge patches 104 of a single type (e.g., having a uniform overall shape such as a box, a truncated pyramid, and a truncated lens). The different shapes in the relevant diagrams are offered as few non-limiting examples. Each PS 102 also includes one or more electrodes 108 for reading out from the PS 102 a detection signal resulting from conversion of light impinging on the photodiode to electric charge. Electrodes 108 may conveniently be made of metal, or any other suitable conductive material. At least one of the readout electrodes 108 should be connected to either the Si or the Ge of each PS 102. The other electrodes 108 may be connected to each PS 102, or can be used in common for several PSs 102 and even to the whole array. A few possible arrangements of electrodes 108 are exemplified in the different drawings 1A-1E in a non-limiting manner, and irrespectively of other elements of the respective FPA 100 (such as shape of the Ge patch 104). It is noted that one or more parts of the Ge 104 may be doped in order to increase efficiency. Different areas of the Ge may be doped differently (e.g., using different dopants and/or at different doping degrees).

In addition, FPA 100 also includes a continuous silicon (Si) layer 110 to which the Ge and other materials of the FPA 100 are connected. Continuous Si layer 110 may be the substrate Si wafer on which the Ge is implemented, or an epitaxial layer grown with desired properties. Optionally, Si layer 110 may be polished during manufacturing in order to reduce its thickness, e.g., down to a few micrometers or to a few tens of micrometers (e.g., 4 µm, 8 µm, 15 µm, 30 µm). The continuous Si layer is continuous in that it continues from one PS 102 to another, possibly throughout the entire FPA 100.

FIG. 1A exemplifies an implementation of FPA sensor 100 in which the Ge is processed in order to create a plurality of steep structures of Ge (e.g., needles, pyramids, ridges) by which a greater number of photons may be absorbed in comparison to un-etched Ge patches. Depending on the physical characteristics of the Ge implemented, the ratio of percent of photons captured by the processed Ge to percent of photons captured by a homogenous Ge bulk having similar convex envelope may differ, and be greater by different ration, such as: by at least 10%, by at least 20%, by at least 30%, by at least 40%, by at least 50%, by at least 60%, or better. The processing of the Ge into a dense arrangement of steep structures 112 may improve its absorption levels for varied reasons, such as but not limited to: (a) an increasing of the surface of the Ge, (b) generation of an effective medium by steep structures 112, in which medium there is a continuous change of the refractive index resulting in reduced Fresnel reflection, and (c) light trapping mechanism by which a reflected photon may have several interaction with the Ge, enhancing the effective probability of absorption.

The term "steep structure" is used to refer to micrometer-scale and nanometer-scale structures whose height is at least twice as long as its width over at least one width aspect. In some embodiments, nanometer-scale structures may be implemented. In some embodiments, micrometer-scale structures may be implemented. A height of steep structures 112 is measured perpendicularly to a plane of the wafer on which the steep structures are manufactured, and the width is measured in parallel to the plane of the wafer. Referring to the coordinates provided in FIG. 1F (which pertains also to FIGS. 1A-1E and 1G-1H), the plane of the wafer is the x-y plane of the coordinate system illustrated, and the height of the steep structures (112) is measured along the z axis. Possibly, the widest width of a steep structure 112 may be less than twice the height of the respective steep structure 112 (e.g., if the steep structure is needle shaped), but this is not necessarily so. The height of the steep structures may vary in different implementations of the disclosure, and even within a single FPA sensor. In an example, the heights of at least 80% of steep structures 112 of a given FPA 100 may be between 1 µm and 2 µm. In an example, the heights of at least 80% of steep structures 112 of a given FPA 100 may be between 1 µm and 1.5 µm. In an example, the heights of at least 80% of steep structures 112 of a given FPA 100 may be between 1.2 µm and 1.5 µm.

It is noted that FPA 100 may be a SWIR FPA that is sensitive to electromagnetic radiation within the SWIR range. For example, FPA 100 may be sensitive to impinging light within any combination of any one or more of the following spectral ranges: 900 nm-1,000 nm, 1,000 nm-1,100 nm, 1,100 nm-1,200 nm, 1,200 nm-1,300 nm, 1,300 nm-1,400 nm, 1,400 nm-1,500 nm, 1,500 nm-1,600 nm, 1,600 nm-1,700 nm. FPA 100 may also be sensitive in other parts of the electromagnetic spectrum (e.g., in the visible range, or part thereof). FPA 100 may be implemented together with optical filters (e.g., chromatic band-pass filter, chromatic band-pass blocker, chromatic low-pass filter, chromatic high-pass filter, polarizer, etc.). The term "short-wave infrared sensor" and similar terms (e.g., "short-wave infrared FPA sensor", "short-wave infrared FPA") as used herein pertain to photosensitive sensors which can absorb and detect impinging short-wave infrared radiation (i.e., radiation whose wavelength is between 1,000 and 1,700 nm). In at least part of the SWIR spectrum, the quantum efficiency of FPA 100 is higher than is achievable by Si based photosensors (which are more suitable to sensing within the visible spectrum). Optionally, SWIR sensors disclosed herein may be sensitive to impinging illumination within subsections of the short-wave IR spectrum (which, for the purposes of the present disclosure, is defined to be between 1,000 nm and 1,700 nm), and even more specifically between 1,200 nm and 1,550 nm. A sensor is defined to be sensitive for a given wavelength within the context of the present disclosure if a quantum efficiency of the sensor for that wavelength is higher than 5%.

Figure 1B:
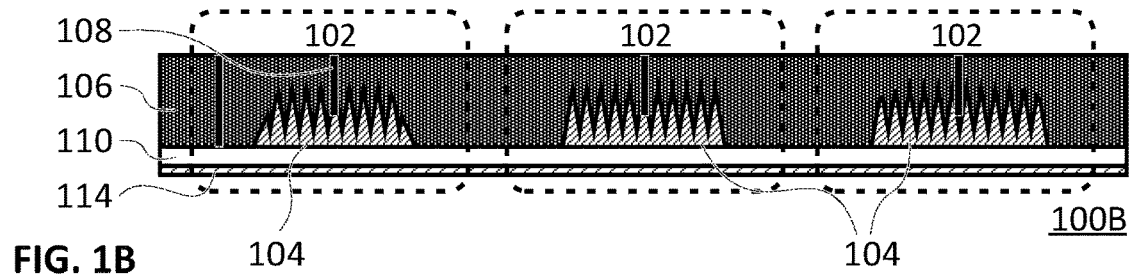

As illustrated in the example of FIG. 1B, FPA sensor 100, may optionally include one or more photo-effective layer 114, which manipulates the illumination passing through it. For example, the photo-effective layer 114 may operate as a chromatic filter, as a polarization filter, as any other type of optical filter, as a retarder, a diffraction grating, or any other type of layer which affect the light radiation which traverse the layer.

Figure 1C:
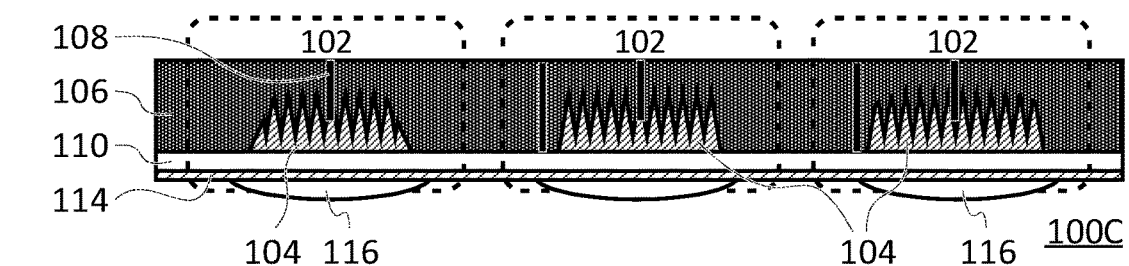

As illustrated in the example of FIG. 1C, FPA sensor 100 may include a layer of microlenses 116 (e.g., a microlens array) which can be added to FPA sensor 100 (either in addition to another type of photo effective layer 114 as illustrated, or as a sole photo effective layer).

Figure 1D:
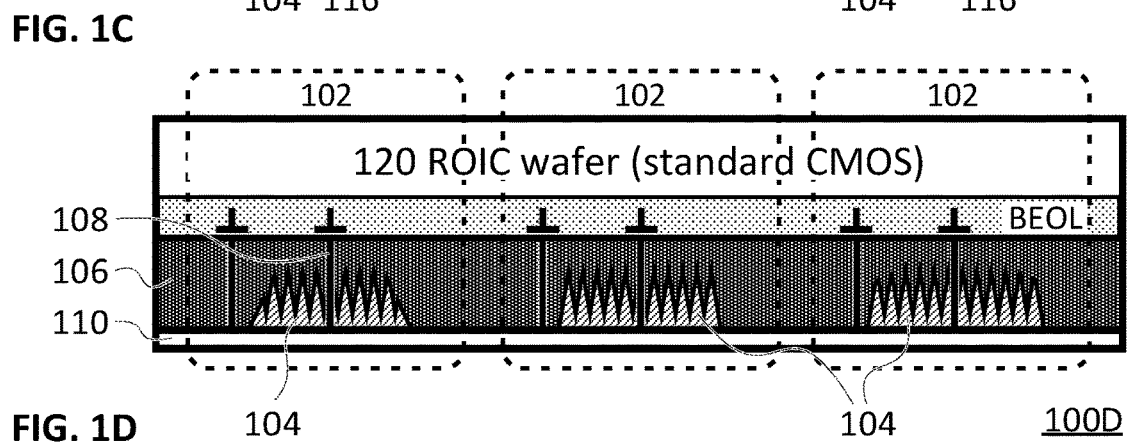

As illustrated in the example of FIG. 1D, FPA sensor 100 may include two wafers, including a second wafer 120 which is coupled to the photosensitive wafer. Wafer 120 includes a readout Integrated Circuit (ROIC) and therefore may be called a ROIC wafer. The ROIC wafer may include, for example, a complementary metal-oxide-semiconductor (CMOS)-based read-out circuitry and optionally also processing circuitry, as well as one or more back-end-of-line (BEOL) layers.

Figure 1E:
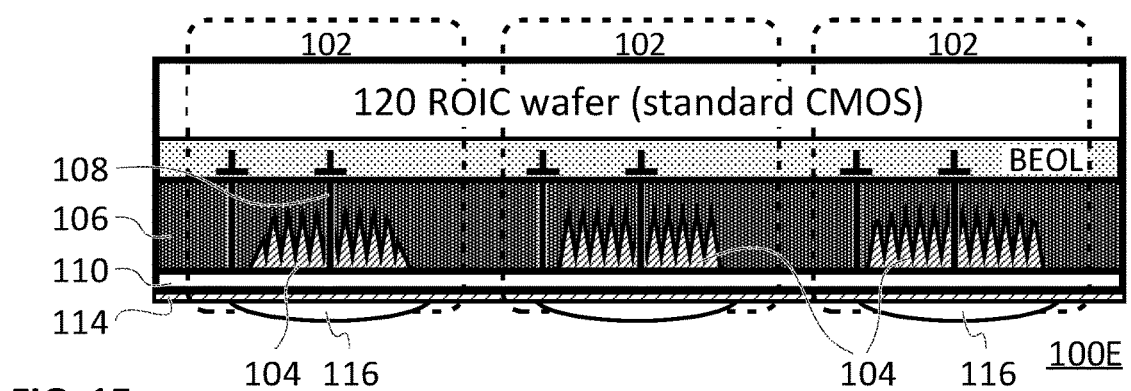

FPA 100 may include any combination of the aforementioned components. For example, as illustrated in the example of FIG. 1E, FPA sensor 100 may include one or more photo effective layers 114, micro-lenses 116, and second wafer 120.

It is noted that while FIGS. 1A through 1E illustrate backside illumination SWIR FPA sensors (in which light from the FOV reaches the photosensitive directly, without passing through metal read-out layers), FPA 100 may also be implemented for front side illumination SWIR FPA sensors (in which light from the FOV reaches the photosensitive after passing the metal read-out layers), mutatis mutandis.

Figure 1F:
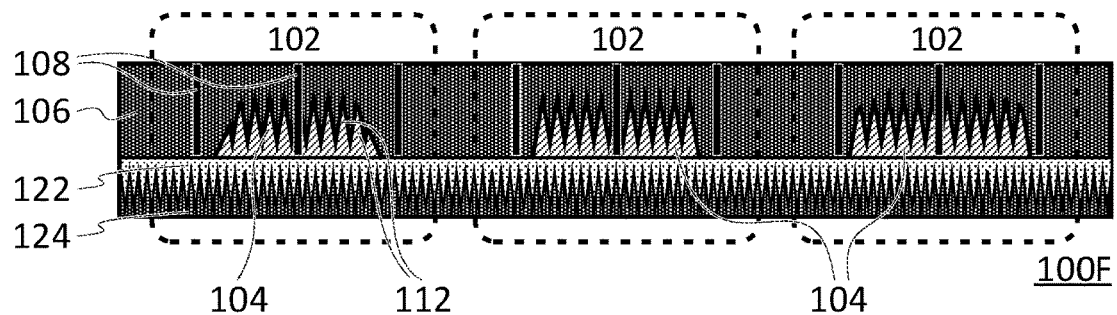
Figure 1G:
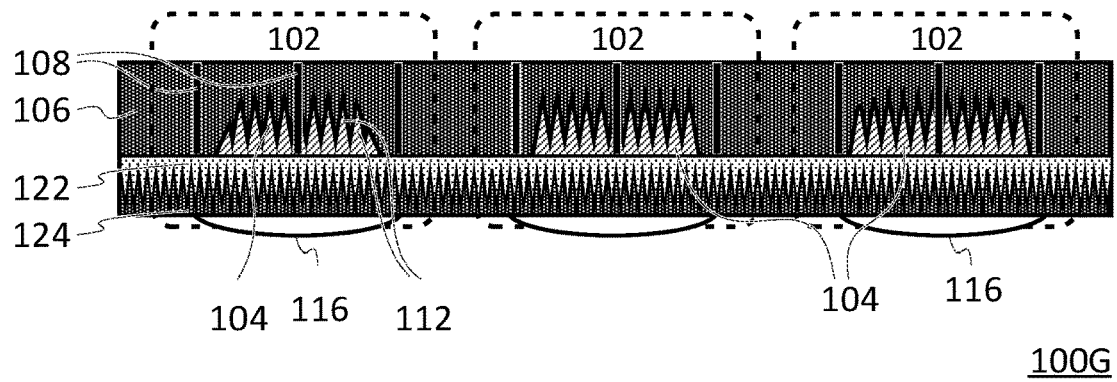
Figure 1H:
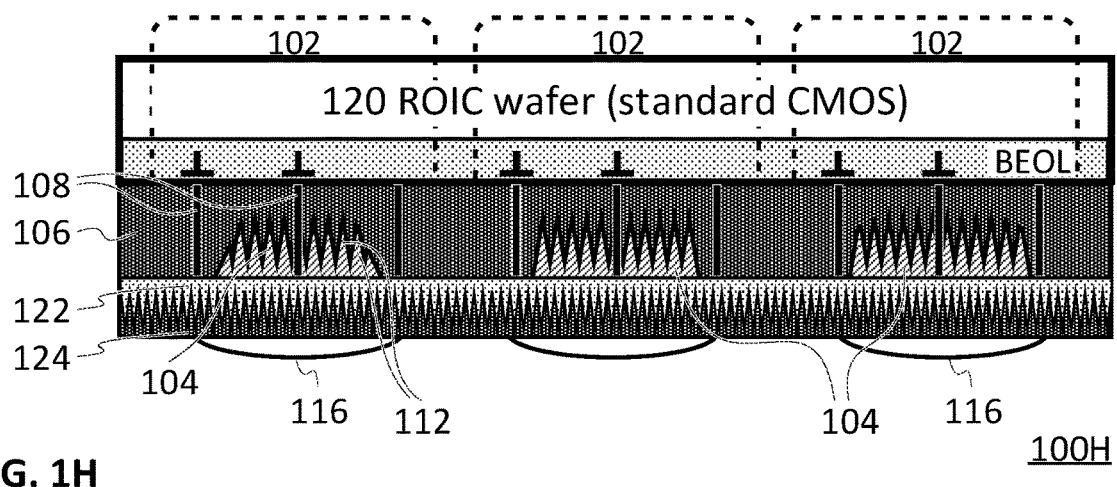

FIGS. 1F through 1H are schematic functional cross section illustrations illustrating examples of short-wave infrared focal plane array (FPA) sensors 100, in accordance with the examples of the presently disclosed subject matter. As demonstrated in the examples illustrated in FIGS. 1F through 1H, optionally, the continuous Si layer 110 of FPA 100 may include a plurality of steep structures, e.g., conforming with the criteria defined above with respect to the Ge steep structures. In such cases, the Si layer is denoted 122 in the diagrams. The plurality of steep structures in Si layer 122 (Si steep structures") may be used, for example, in order to increase the absorption rate of impinging light reaching the FPA at different incidence angles. While not necessarily so, a thickness of Si layer 122 (e.g., measured from the tips of the steep structures to the base of the Ge patch 104) may be between a few micrometers to a few tens of micrometers (e.g., 4 µm, 8 µm, 15 µm, 30 µm). An optional layer 124 may be implemented on top of the Si layer 122, e.g., serving as a passivation layer and/or also as a layer having another functionality, such as a planarization layer. Layer 124 may be made out of any suitable material such as, but not limited to, Si oxide ($SiO_2$), Si nitride ($Si_3N_4$), and so on.

Figure 1I:
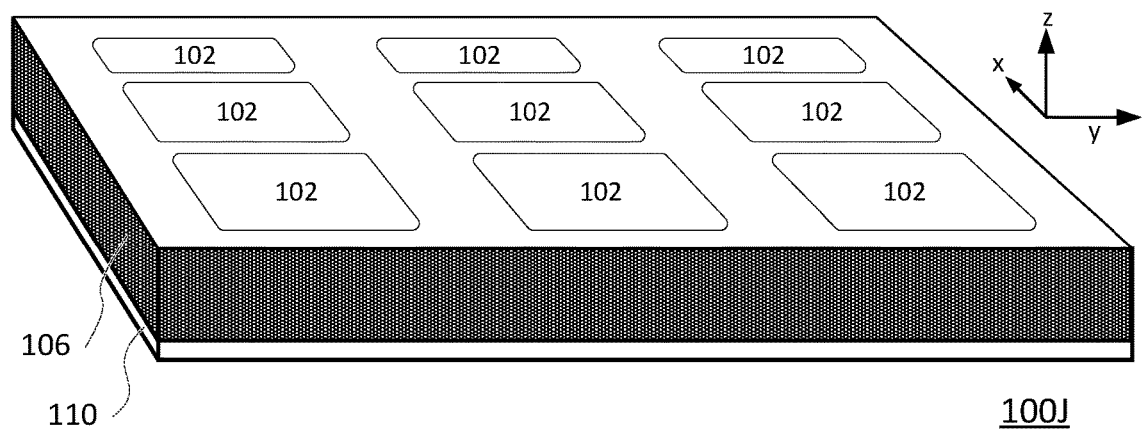

FIG. 1I is a schematic diagonal view of an example of a FPA like FPA 100, in accordance with the examples of the presently disclosed subject matter. In the illustrated example, FPA 100 (denoted in the example FPA 100J) includes an array of 3×3 photosites 190, but obviously any different number of photosites may be implemented, such as 1, 1×10, 2×2, 32×32, 224×144, 320×224, 640×480, 800×600, 1024×768, 1440×900, 2048×1152, 3200×2048, 8192×8192, 15360×8640, and any other number.

Figure 1J:
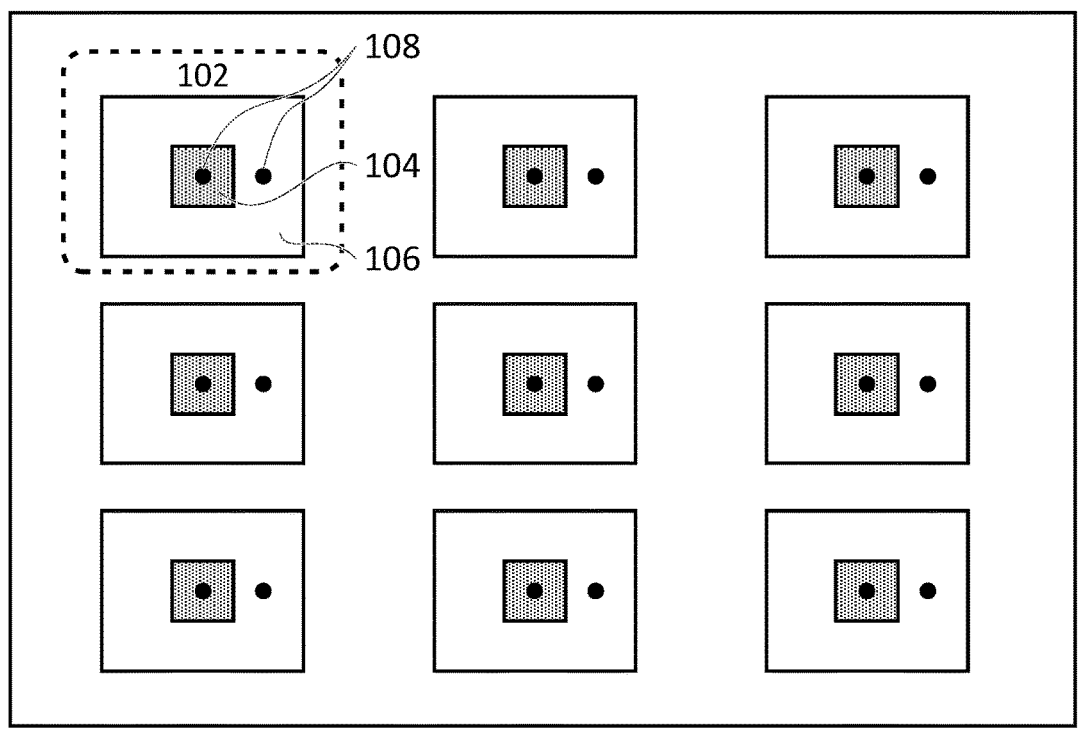

FIG. 1J is a schematic top view diagram of another example of a FPA like FPA 100, in accordance with the examples of the presently disclosed subject matter. In the illustrated example, the different photosites of FPA 100 (denoted in the example FPA 100K) are arranged in a rectangular grid, but any other suitable geometrical arrangement or tiling may be implemented (e.g., honeycomb grid, circular grid, and so on).

FIG. 2 illustrates an embodiment numbered 200 of a method for manufacturing a focal plane array, in accordance with examples of the presently disclosed subject matter. Optionally, method 200 may be used for manufacturing of FPAs (or parts thereof) such as the ones illustrated in and discussed with respect to FIGS. 1A-1J, and especially for manufacturing of SWIR FPAs, but this not necessarily so. Two non-limiting examples for a process of manufacturing an FPA (such as a SWIR FPA) are provided in FIGS. 3A and 3B, which may facilitate understanding of method 200 and its different stages.

Stage 202 of method 200 includes etching a Ge layer implemented on a Si wafer so as to remove different amount of Ge from different locations of the Ge layer, so as to yield for each out of a plurality of PSs of the SWIR focal plane array at least one distinct photosensitive area of Ge which includes a plurality of proximate structures of Ge (e.g., the "Ge steep structures" above) having height of at least 0.3 µm and having a height-to-width ratio of at least 2. Referring to the coordinate system provided in FIG. 1F, the width is measured within the x-y plane, while the height is measured along the z axis. Steeper height-to-width ratios (e.g., >3, >4, >5, >10) may also be implemented. It is noted that the respective distinct photosensitive area of Ge may include less steep structures (e.g., shorter needles), for example resulting from the manufacturing process, but most of the steep structures have height-to-width ratios higher than the aforementioned threshold (e.g., 2, 3, etc.). It is noted that the proximate structures of Ge may be connected to one another at a bottom of the structures (e.g., as exemplified in the drawings). While not necessarily so, a thickness of the layer of Ge connecting the different structures may be thinner than a height of the steep structures (e.g., 1 µm). Referring to the examples of the accompanying drawings, the Ge layer may be Ge layer 104.

Stage 202 greatly improves the absorption rate of light impinging on the distinct Ge area. Referring to the example of FIG. 3A, stage 202 may be implemented in the transition between the states illustrated in diagrams 302 and 304. Referring to the example of FIG. 3B, stage 202 may be implemented in the transition between the states illustrated in diagrams 322 and 324. It is noted that similarly to FIGS. 1A-1J, the three illustrated PSs are of different shapes for sake of example only. The term "distinct photosensitive area of Ge" broadly includes an area of Ge that is separated from other such areas by at least one Ge free zone. A cross-section of each distinct photosensitive area of Ge parallel to the plane of the wafer may be substantially square, substantially rectangular, substantially circular, substantially elliptical, or of any other enclosed shape. A diameter of such a cross-section may be of different sizes, such as (but not limited to) between 1 µm and 5 µm.

The etching of stage 202 may be implemented, for example by reactive ion etching (RIE). For example, chlorine-based RIE or fluorine-based RIE may be used. For example, non-pulsed RIE may be used. In another example, metal enhanced etching may be used for the etching of the Ge layer to provide the steep structures. Optionally, the generation of the steep Ge structures may be achieved by processes other than etching, such as laser processing.

Optionally, the etching of stage 202 may include etching the Ge layer at its back side (through which light escapes the Ge, after entering the Ge layer from the Si layer). The steep structures of Ge are used for limiting the amount of light leaving the Ge before it is absorbed. Alternatively, the other side of the Ge layer may be etched (through which light enters the Ge layer).

Stage 204 of method 200 includes depositing a filler material on the etched Ge, to fill the gaps between the proximate structures of Ge up to at least a mean height of the proximate structures of Ge. Optionally, the filler material may entirely cover the Ge layer. Referring to the examples of FIGS. 3A and 3B, stage 204 may be implemented in the transition between the states illustrated in diagrams 304 and 306, and 324 and 326, respectively. The filling material deposited may also cover other components of the manufactured wafer such as electrodes, metal layer components, passivation layer components, and so on (e.g., as exemplified in the drawings). It is noted that one or more processing stages of the wafer may separate the etching of stage 202 and the depositing of the filler material of stage 204. Examples of some such stages include doping, trenching, polishing, laying metal layers, and so forth (where each such stage may optionally include a plurality of sub-stages). Different techniques may be used for depositing the filler material in stage 204. For example, the depositing of the filler material may include Chemical Vapor Deposition (CVD) of the filler, sputtering of the filler material, or other ways known in the art.

The depositing of the filler material in stage 204 may serve structural, geometrical, and electrical purposes, among other possible purposes, and the filler material may be selected to best serve a desired balance between such purposes. Few non-limiting examples of filler material include Si dioxide ($SiO_2$), Si nitride ($Si_3N_4$), and various polymers. Such materials may bond well to both Si layers and Ge patches of the wafer, and provide electric passivation for the Ge (and possibly also for the underlying Si). Optionally, a refractive index of the material selected as filler material may be relatively low with respect to Ge, in order to reduce reflection of light and increase the absorption of SWIR radiation by the arrangement of steep structures of Ge in each PS. For example, the refractive index of the filler material may be lower than 2 for the relevant wavelengths (e.g., between 1 µm and 1.5 µm or part of that spectrum). For example, the refractive index of the filler material may be lower than 1.75 for the relevant wavelengths (e.g., between 1 µm and 1.5 µm or part of that spectrum)

Stage 206 of method 200 includes polishing a top surface of the Si wafer. By way of example, the polishing of stage 206 may be carried out in order to prepare the Si wafer for bonding with another wafer of a photosensitive detection array (e.g., for bonding with wafer 420 of photosensitive detection array 450 of system 400, exemplified in FIG. 5), in relevant implementations. The other wafer may be a Readout Integrated Circuit (ROIC), e.g., as exemplified in FIG. 1D. It is noted that the aforementioned top surface of the wafer includes the filler material and possibly also Ge. In some implementations, the Ge is completely covered by the filler material after the polishing of stage 206, e.g., if the filler material is used for passivation purposes. In some implementations, parts of the Ge may remain exposed, e.g., in order to allow connection of electrodes to the Ge. However, this is not necessarily so. Optionally, electrodes may reach the Ge (if necessary) via dedicated holes which are created after overlaying the Ge with the filler material. Referring to the examples of FIGS. 3A and 3B, stage 206 may be implemented in the transition between the states illustrated in diagrams 306 and 308 (and 326 and 328, respectively). It is noted that the polishing of stage 206 may precede the depositing of metal of stage 208 or follow it. The polishing of stage 206 may be carried out in any suitable manner, such as (but not limited to) chemical mechanical polishing (CMP).

Stage 208 of method 200 includes depositing a metal layer for creating a plurality of electric contacts for each out of the plurality of PSs for reading out detection information detected by the respective PS. Referring to the examples of FIGS. 3A and 3B, stage 208 may be implemented in the transition between the states illustrated in diagrams 310 and 312 (and 330 and 332, respectively). Furthermore, while not necessarily so, in some implementations, stage 208 may optionally be executed prior to the depositing of the filler material of stage 204.

The electric contacts deposited in stage 208 may optionally be used to read out electric information from the patches of Ge (the plurality of distinct photosensitive areas of Ge) by either touching the Ge or being sufficiently proximate to the Ge. The readout from Ge patches may be from a doped or undoped parts of Ge. Electric contacts may be implemented to read electric signals from other parts of the PSs (e.g., Si parts). Other types of electrodes may be implemented to readout electric data from parts of the Si wafer not associated with a single PS (e.g., serving a group of several adjacent PSs, serving all of the PSs, and so on. Such parts may include Si, or other parts of the wafer).

Preparations for connection of the Ge to metal electrodes—where applicable—may be taken as part of stage 202. Optionally, the etching of the Ge layer may include protecting for each PS of the focal plane array a flat portion of Ge, and the depositing of the metal layer may include creating a metal electric contact which is connected to the respective distinct photosensitive Ge area at the flat portion, for reading out electric data from the respective distinct photosensitive Ge area.

Figure 3A:
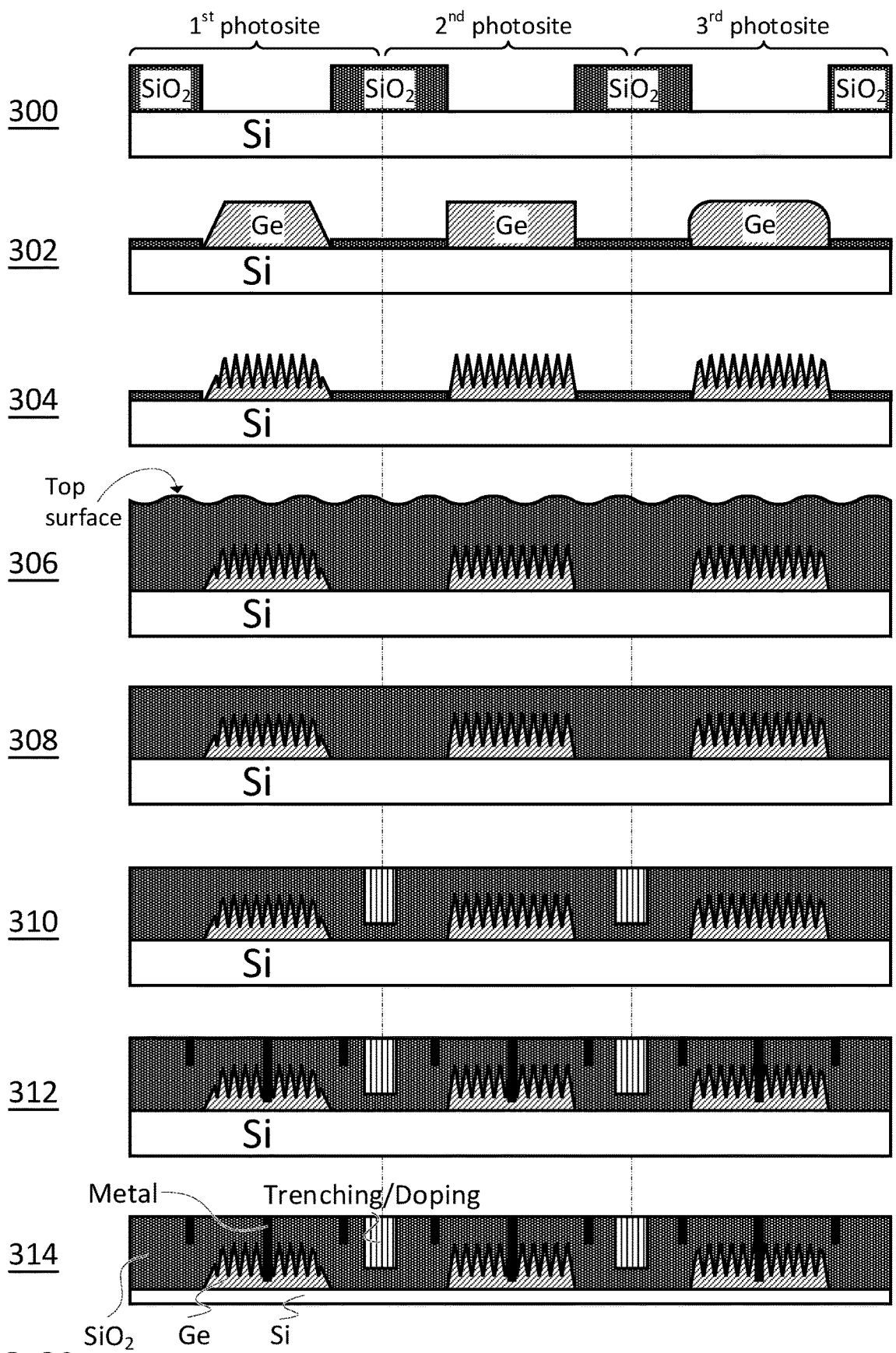
FIG. 3A includes schematic functional cross section illustrations illustrating different stages in a manufacturing process of an example FPA sensor, in accordance with the examples of the presently disclosed subject matter.
Figure 3B:
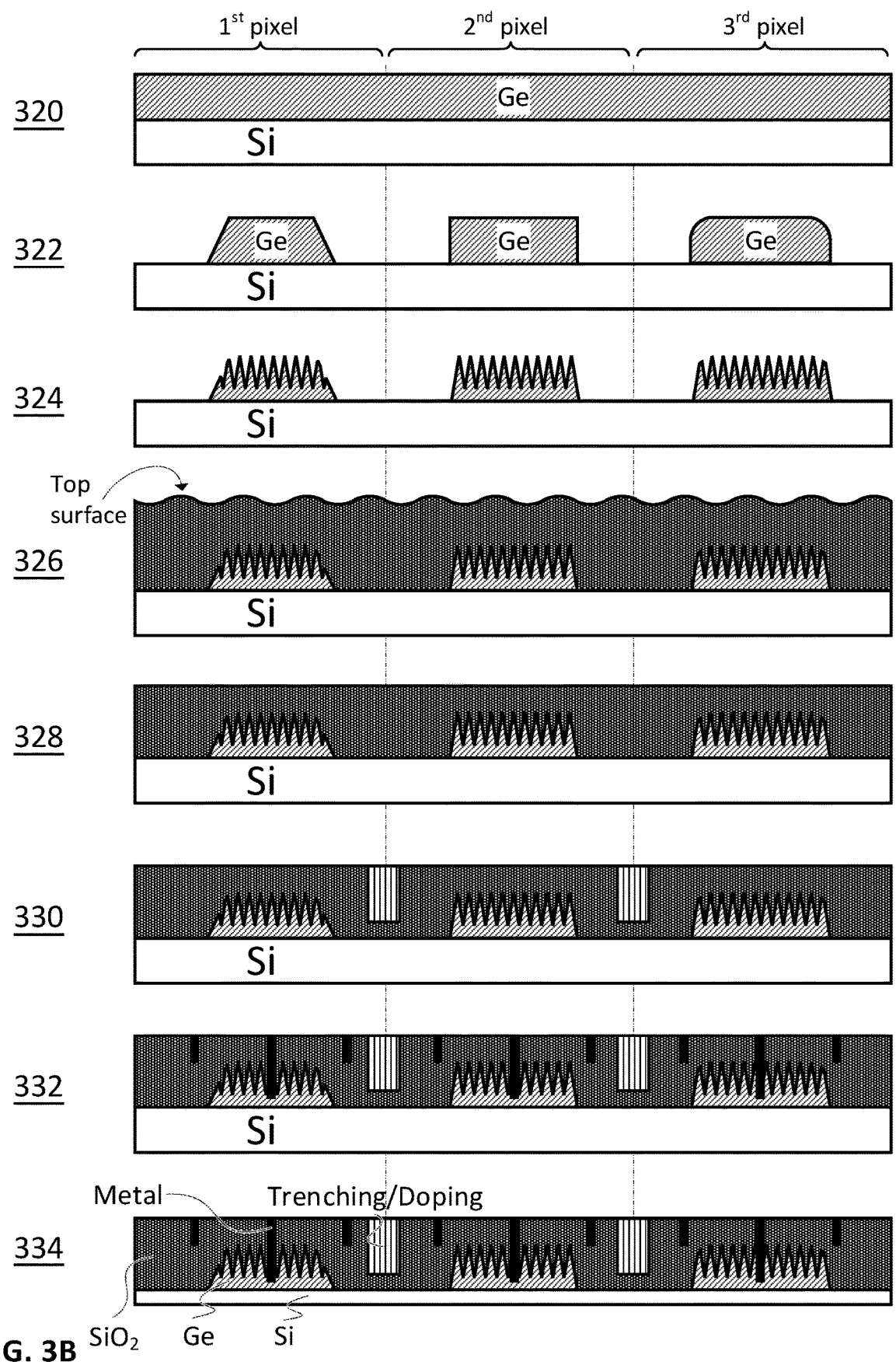
FIG. 3B includes schematic functional cross section illustrations illustrating different stages in a manufacturing process of an example FPA sensor, in accordance with the examples of the presently disclosed subject matter.

Referring to FIGS. 3A and 3B, it is noted that manufacturing processes (also referred to as "stages") other than those discussed with respect to FIG. 2 are also illustrated, and that such stages (among other optional stages) may be part of method 200, even if not explicitly elaborated. Referring to FIG. 3A, and especially to diagram 302, the Ge layer may include isolated patches of Ge, either grown of flat substrate or within pockets. Method 200 may include growing the Ge layer into such patches, or processing a wafer which already includes such patches of Ge. Referring to method 200 as a whole, the Ge layer may optionally include a plurality of unconnected areas of Ge, each deposited onto a Si layer within a depression created within a previously deposited layer deposited on the Si layer. The previously deposited layer may include the same filler material which is used for the filling of stage 204 or another material (e.g., another passivation material). Method 200 may optionally include the aforementioned deposited layer in which the Ge is grown. Method 200 may optionally include processing that layer to create pockets (e.g., by etching). It is noted that growing the patches of Ge within pockets whose bottom is made of Si but whose walls are made from another material on which Ge does not grow as easily may be implemented in order to generate a higher quality crystal of Ge.

Referring to FIG. 3B, and especially to diagram 322, it is noted that the Ge layer may be a continuous layer processed to separate the continuous layer into a plurality of disconnected area serving different PSs. Method 200 may optionally include growing the continuous Ge layer (e.g., as illustrated in diagram 320) and/or processing the Ge (e.g., by etching) to manufacture stand-alone patches of Ge. Methods for growing Ge on Si are known in the art.

The layer of Ge (whether continuous, in patches, in pockets, etc.) may be of a preliminary thickness prior to the etching, and a different etched thickness (measured to the top of the steep structures) following the etching of stage 202. For example, the preliminary thickness of the Ge layer may be less than 10 μm. For example, the preliminary thickness of the Ge layer may be less than 7 μm. For example, the preliminary thickness of the Ge layer may be less than 5 μm. For example, the preliminary thickness of the Ge layer may be less than 4 μm. For example, the preliminary thickness of the Ge layer may be less than 3 μm. The etched thickness of the layer of Ge may be equal or less than the preliminary thickness. For example, the etched thickness may be between 0 μm and 0.5 μm narrower than the preliminary thickness. For example, the etched thickness may be between 0.5 μm and 1 μm narrower than the preliminary thickness. For example, the etched thickness may be between 1 μm and 1.5 μm narrower than the preliminary thickness. For example, the etched thickness may be between 1.5 μm and 2 μm narrower than the preliminary thickness. For example, the etched thickness may be between 2 μm and 2.5 μm narrower than the preliminary thickness. For example, the etched thickness may be between 2.5 μm and 3 μm narrower than the preliminary thickness.

Method 200 may also include polishing the layer of Ge—before or after the etching of stage 202, or both—in order to achieve higher uniformity between the thickness of Ge layer of the different PSs.

Reverting to the etching of stage 202, the mean height of the proximate structures of Ge may be larger than 1 μm and a mean height-to-width ratio of the proximate structures of Ge may be 5 or higher (e.g., about 6, about 7, about 8).

Referring to diagrams 310 and 330 of FIGS. 3A and 3B respectively, it is noted that isolating the different PSs from one another may optionally be implemented in the Si layer, in the filler material layer, in a passivation layer in which the Ge is deposited (e.g., as illustrated), or in any combination of two or more of the aforementioned layers. Such separating of PSs may include trenching (e.g., deep trench isolation, shallow trench isolation), doping, or any other suitable process. The timing of such separation within the execution of method 200 depends on the one or more layer in which it is executed. For example, such PS separation (e.g., by trenching, by doping) may be executed before and/or after the depositing of the Ge layer. Optionally, the growing of the Ge layer (if part of method 200) is preceded by processing the Si layer on which the Ge is deposited, where the processing includes at least one process selected from a group of wafer processing stages consisting of: doping, welling, passivation, and electrical contacts depositing. In addition to separation of PSs, processing of the Si layer (or of the other layers of the FPA, e.g., in any of the aforementioned types of processes) may also be used for other purposes such as creating doped regions (N regions and/or P regions), for creating contacts, etc. Notably, the doping of the one or more materials of the FPA (e.g., Si, Si oxide, Si nitride, Ge) may include doping different portions of the respective material (e.g., Si, Ge, and so forth) to different doping degrees and/or with different dopants. Optionally, method 200 may include highly doping the Ge such as to make it detect also in longer wavelengths. Optionally, method 200 may include doping the Si such as to make a diode in the Si for the purpose of photodetection of SWIR light that will be absorbed in the Ge and will generate carriers that will be transported to the Si layer.

Referring for example to diagrams 314 and 334 of FIGS. 3A and 3B respectively, it is noted that method 200 may optionally include polishing a Si substrate of the Si wafer to a thickness of less than 20 μm. For example, an initial thickness of the Si substrate layer may be about 800 μm. The polishing of the Si layer (or any suitable alternative process for reducing the thickness of the Si substrate layer) may even reduce the thickness of the Si layer to less than 10 μm, less than 5 μm, etc. The reducing of the thickness of the Si layer may be used, for example, in order to reduce geometrical optical considerations, such as leaking of light between neighboring photosites. While not necessarily so, the polishing of the Si layer (as exemplified in diagrams 314 and 334) may be executed after the processing of all of the upper layers have concluded (e.g., when structural support is no longer needed). Optionally, the polishing of the Si layer (e.g., down to a thickness of several micrometers) may be executed after bonding of the Si wafer to another wafer (e.g., a ROIC wafer) which provides the structural support.

Method 200 may continue (either after polishing of the Si layer or without it) by connecting (e.g., bonding) one or more layers to the bottom side of the Si layer. Such other layers may include optical filters, micro-lens array, and so on (e.g., as demonstrated and discussed with respect to FIGS. 1B, 1C). Method 200 may include, following the polishing of the Si substrate, at least one photo effective layer (e.g., micro-lenses, polarizer, chromatic filter) to the polished side of the Si substrate.

Method 200 may optionally continue (either after polishing of the Si layer or without it) by processing the Si layer to provide a plurality of Si steep structures, e.g., as discussed above with respect to FIGS. 1F through 1H.

Referring to the example of FIG. 1D, method 200 may also include bonding the Si wafer (on which the Ge layer was etched) to a ROIC wafer (or any other wafer such as discussed with relation to stage 206), such that electrodes of the Si wafer touch electrodes of the ROIC wafer (whether metal electrodes or any other suitable type of electrodes), thereby enabling processing by the ROIC wafer of electric signals corresponding to a number of photons captured by the Ge based PSs of the Si wafer.

Reverting to the non-limiting examples of FIGS. 1A through 1J, a focal plane array (FPA) which includes a plurality of photosensitive PSs is disclosed. Optionally, the FPA may be a SWIR FPA. While not necessarily so, that FPA may be manufactured according to method 200. Regardless of the process of manufacturing, any variations discussed with respect to method 200 may be applied to the presently disclosed FPA, mutatis mutandis. The presently disclosed SWIR FPA includes at least:

(a) a Si layer through which light detectable by the FPA reaches photodiodes of the FPA, (b) at least one Ge layer including a plurality of distinct photosensitive areas including at least one photosensitive area in each of the plurality of photosensitive PSs, each of the distinct photosensitive areas comprising a plurality of proximate structures of Ge having height of at least 0.3 μm and which have a height-to-width ratio of at least 2;

(c) at least one passivation layer covering the plurality of distinct photosensitive areas, wherein the passivation layer fills gaps between the proximate structures of Ge up to at least a mean height of the proximate structures of Ge;

(d) a polished top surface to which another wafer of the photosensitive detection array may be bonded; and (e) a plurality of electrodes (e.g., metal electrodes) for transmitting electric signals indicative of number of photons absorbed by the different distinct photosensitive areas of Ge to the other wafer.

The disclosed FPA may be FPA 100, but this is not necessarily so. Optionally, each PS of the FPA includes a flat portion of Ge coupled to the plurality of proximate structures of the respective PS, and at least one metal electrode coupled to the flat portion. Optionally, a thickness of the Si layer is less than 20 μm. Optionally, the FPA further includes at least one additional layer bonded to the polished side of the Si layer, which can manipulate amplitude, phase, polarization, or spectral-response of light.

Optionally, the FPA further includes a Readout Integrated Circuit (ROIC) wafer bonded to the Si wafer which includes the proximate structures of Ge, where metal electrodes of the Si wafer touch metal electrodes of the ROIC wafer, thereby enabling processing by the ROIC wafer of electric signals corresponding to a number of photons captured by the Ge based PSs of the Si wafer. The ROIC wafer in such case may include at least one output interface for providing detection data indicative of the number of photons detected by different PSs to an external system. Optionally, a thickness of the Ge layer is less than 5 μm. Optionally, a thickness of the Ge layer is less than 10 μm. Optionally, the mean height of the proximate structures of Ge is larger than 1 μm and wherein a mean height-to-width ratio of the proximate structures of Ge is at least 5. Optionally, the SWIR FPA includes a second plurality of second PSs which include substantially flat patches of Ge (e.g., unetched patches of Ge), wherein each of the second PSs includes at least one metal electrode connectable to the ROIC wafer. Implementing two or more types of Ge based photosensitive PSs may be used, for example, in order to create an FPA in which the different characteristics of the different types of PSs (e.g. absorption rate, dark current, signal to noise ratio) allows different types of PSs to outperform other types of PSs in the FPA in different scenarios (e.g., amount of detected light, operational temperature, and so on). The thickness of the Ge layer for the different types of PS (before and/or after etching) may optionally differ.

Figure 4:
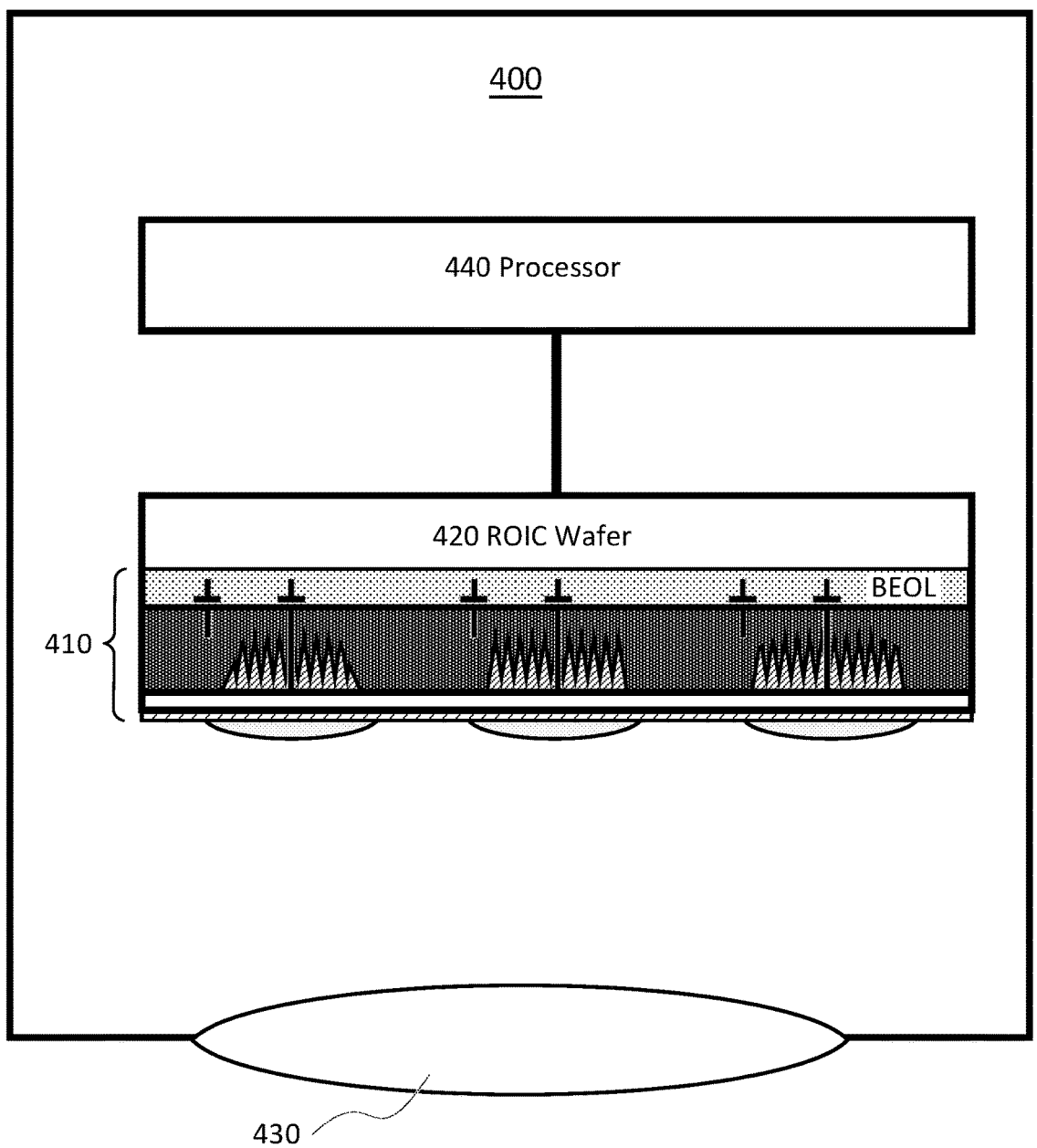
FIG. 4 illustrates an embodiment of an electro-optical (EO) detection system in accordance with examples of the presently disclosed subject matter.

FIG. 4 illustrates electro-optical (EO) detection system 400 in accordance with examples of the presently disclosed subject matter. EO detection system 400 includes at least:

(a) any one of the focal plane arrays discussed above (either a SWIR FPA or another type of FPA), denoted 410 in the diagram;

(b) at least one optical interface 430 for directing light from a field of view (FOV) of the EO detection system onto the FPA (represented in the diagram by a lens; may include any combination of suitable optical components such as mirrors, lenses, prisms, optic fibers, spectral filters, polarizers, other filters, windows, retarders, and so on;

(c) a Readout Integrated Circuit (ROIC) wafer 420 bonded to the Si wafer of FPA 410 such that electrodes of the Si wafer touch electrodes of the ROIC wafer, thereby enabling processing by the ROIC wafer of electric signals corresponding to a number of photons captured by the Ge based PSs of the Si wafer. ROIC wafer 420 includes at least one output interface for providing detection data indicative of the number of photons detected by different PSs to an external system;

(d) a processor 440, operable to process the detection data provided by the ROIC wafer in order to provide an image (e.g., IR image, a SWIR image, a VIS image, a VIS+SWIR image) of the field of view. A SWIR image of the FOV is an image in which the signal of each PS (or the otherwise represented PS intensity) corresponds to the amount of SWIR light arriving from a certain part of the FOV to the respective PS. The term VIS pertains to the visible part of the electromagnetic image, or part thereof.

System 400 may include may other components not illustrated in the diagram, such as power source, active light source (e.g., laser, LED), casing, communication modules, system-level filters, and so on. Many such components are known in the art, and are not included for reasons of simplicity and clarity.

In addition to (or instead of) processing the detection data to generate one or more SWIR images of the FOV, the processor may optionally be configured to process the detection data in order to determine a presence of at least one object in the field of view. Such objects may include people, vehicles, roads, buildings, earth, rocks, natural objects such as plants and animals, manmade objects, stars, and so on. The processor may also process the detection data of the FPA in other ways, many of which are known in the art with respect to prior art sensors, and can be modified to process the detection data of the presently disclosed FPA sensor. For example, the processor may process data acquired by the FPA in order to assess distance of different objects in the FOV from system 400.

The connections as discussed herein may be any type of connection suitable to transfer signals from or to the respective nodes, units, or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals. Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the disclosure. It will be appreciated that the embodiments described above are cited by way of example, and various features thereof and combinations of these features can be varied and modified.

What is claimed is:

1. A method for manufacturing a short-wave infrared (SWIR) focal plane array (FPA), the method comprising:
   etching a germanium (Ge) layer implemented on a silicon (Si) wafer to remove different amounts of Ge from different locations of the Ge layer, so as to yield for each of a plurality of photosites of the SWIR focal plane array at least one distinct photosensitive area of Ge that comprises a plurality of proximate structures of Ge having a height of at least 0.3 µm and a height-to-width ratio of at least 2, wherein the etching comprises etching the Ge layer at a side of the Ge layer through which light escapes the Ge after entering the Ge layer from the Si layer;
   depositing filler material on the etched Ge layer to fill gaps between the proximate structures of Ge up to at least a mean height of the proximate structures of Ge;
   polishing a top surface of the Si wafer to prepare the Si wafer for bonding with another wafer of a photosensitive detection array; and
   depositing a metal layer for creating a plurality of electric contacts for each out of the plurality of photosites for reading out detection information detected by the respective photosite.

2. The method according to claim 1, wherein the etching of the Ge layer comprises protecting for each photosite of the focal plane array a flat portion of Ge, and wherein the depositing of the metal layer comprises creating a metal electric contact connected to the respective distinct photosensitive Ge area at the flat portion, for reading out electric data from the respective distinct photosensitive Ge area.

3. The method according to claim 1, further comprising bonding the Si wafer on which the Ge layer was etched to a Readout Integrated Circuit (ROIC) wafer, such that electrodes of the Si wafer touch electrodes of the ROIC wafer, thereby enabling processing by the ROIC wafer of electric signals corresponding to a number of photons captured by the Ge based photosites of the Si wafer.

4. The method according to claim 1, wherein a thickness of the Ge layer is less than 10 µm.

5. The method according to claim 1, wherein the etching of the Ge layer is preceded by growing the Ge layer on the Si wafer; wherein the growing is preceded by processing a Si layer on which the Ge is deposited, the processing comprising at least one process selected from a group of wafer processing stages consisting of: doping, welling, passivation, and electrical contacts depositing.

6. The method according to claim 1, wherein the Ge layer comprises of unconnected areas of Ge, each deposited onto a Si layer within a depression created within a previously deposited layer deposited on the Si layer on which the Ge is grown.

7. The method according to claim 1, wherein the mean height of the proximate structures of Ge is larger than 1 µm and wherein a mean height-to-width ratio of the proximate structures of Ge is at least 5.

8. The method according to claim 1, wherein the depositing comprising at least one depositing process selected from the group of processes consisting of chemical vapor deposition of the filler and sputtering of the filler.

9. The method according to claim 1, further comprising doping the Ge such as to make a photodiode which includes the Ge, and which can detect SWIR light.

10. The method according to claim 1, further comprising doping the Si such as to make a diode in the Si for the purpose of photodetection of SWIR light that will be absorbed in the Ge and will generate carriers that will be transported to the Si layer.

11. A SWIR focal plane array produced by the method of claim 1.

12. A method for manufacturing a short-wave infrared (SWIR) focal plane array (FPA), the method comprising:
    etching a germanium (Ge) layer implemented on a silicon (Si) wafer to remove different amounts of Ge from different locations of the Ge layer, so as to yield for each of a plurality of photosites of the SWIR focal plane array at least one distinct photosensitive area of Ge that comprises a plurality of proximate structures of Ge having a height of at least 0.3 µm and a height-to-width ratio of at least 2,
    depositing filler material on the etched Ge layer to fill gaps between the proximate structures of Ge up to at least a mean height of the proximate structures of Ge;
    polishing a top surface of the Si wafer to prepare the Si wafer for bonding with another wafer of a photosensitive detection array; and
    depositing a metal layer for creating a plurality of electric contacts for each out of the plurality of photosites for reading out detection information detected by the respective photosite; and
    polishing a Si substrate of the Si wafer to a thickness of less than 20 µm.

13. The method according to claim 12, wherein the polishing of the Si substrate is followed by bonding at least one dielectric layer to the polished side of the Si substrate for the purpose of manipulating at least one light property of light passing through, the at least one property selected from a group consisting of: the amplitude, phase, polarization and/or spectral properties of light.

14. A short-wave infrared (SWIR) focal plane array (FPA) with a plurality of photosensitive photosites, the SWIR FPA comprising:
    a silicon (Si) layer having a thickness of less than 20 µm, through which light detectable by the FPA reaches photodiodes of the FPA,
    at least one germanium (Ge) layer including a plurality of distinct photosensitive areas including at least one photosensitive area in each of the plurality of photosensitive photosites, each of the distinct photosensitive areas comprising a plurality of proximate structures of Ge having height of at least 0.5 µm and a height-to-width ratio of at least 2;

a passivation layer covering the plurality of distinct photosensitive areas, wherein the passivation layer fills gaps between the proximate structures of Ge up to at least a mean height of the proximate structures of Ge;

a polished top surface to which another wafer of a photosensitive detection array may be bonded; and a plurality of metal electrodes for transmitting electric signals indicative of number of photons absorbed by the different distinct photosensitive areas of Ge to the other wafer.

15. The SWIR FPA according to claim 14, each photosite of the FPA comprises a flat portion of Ge coupled to the plurality of proximate structures of the respective photosite, and at least one metal electrode coupled to the flat portion.

16. The SWIR FPA according to claim 14, further comprising at least one photo effective layer bonded to the polished side of the Si layer.

17. The SWIR FPA according to claim 14, wherein a thickness of the Ge layer is below 5 µm.

18. The SWIR FPA according to claim 14, wherein the mean height of the proximate structures of Ge is larger than 1 µm and wherein a mean height-to-width ratio of the proximate structures of Ge is at least 5.

19. The SWIR FPA according to claim 14, further comprising a second plurality of second photosites which includes substantially flat patches of Ge, wherein each of the second photosites comprises at least one electrode connectable to the other wafer.

20. An electro-optical (EO) detection system, comprising:

the SWIR FPA according to claim 14;

at least one optical interface for directing light from a field of view of the EO detection system onto the SWIR FPA;

a Readout Integrated Circuit (ROIC) wafer bonded to the Si wafer of the FPA, wherein metal electrodes of the Si wafer touch metal electrodes of the ROIC wafer, thereby enabling processing by the ROIC wafer of electric signals corresponding to a number of photons captured by the Ge based photosites of the Si wafer, wherein the ROIC wafer comprises at least one output interface for providing detection data indicative of the number of photons detected by different photosites to an external system; and a processor, operable to process the detection data provided by the ROIC wafer in order to provide an IR image of the field of view.

* * * * *